United States Patent
Chen et al.

(10) Patent No.: US 9,991,178 B2
(45) Date of Patent: Jun. 5, 2018

(54) INTERPOSER AND ELECTRICAL TESTING METHOD THEREOF

(75) Inventors: Lu-Yi Chen, Taichung (TW); Chi-Hsin Chiu, Taichung (TW); Shih-Kuang Chiu, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 941 days.

(21) Appl. No.: 13/619,528

(22) Filed: Sep. 14, 2012

(65) Prior Publication Data
US 2013/0249589 A1    Sep. 26, 2013

(30) Foreign Application Priority Data
Mar. 22, 2012 (TW) .............................. 101109806 A (51) Int. Cl.
*H01L 21/66* (2006.01)
*H01L 23/498* (2006.01)
*H01L 21/48* (2006.01)

(52) U.S. Cl.
CPC ............ *H01L 22/14* (2013.01); *H01L 21/486* (2013.01); *H01L 22/20* (2013.01); *H01L 23/49816* (2013.01); *H01L 23/49822* (2013.01); *H01L 23/49827* (2013.01); *H01L 2224/16* (2013.01)

(58) Field of Classification Search
CPC ...... H01L 22/20; H01L 22/14; H01L 121/486
See application file for complete search history.

(56) References Cited

U.S. PATENT DOCUMENTS

| | | | |
|---|---|---|---|
| 8,333,597 B2 * | 12/2012 | Tamura | ........................... 439/66 |
| 2004/0041556 A1 * | 3/2004 | Martin | ............... G01R 1/07314 324/750.24 |
| 2006/0154497 A1 * | 7/2006 | Amemiya et al. | ............... 439/66 |
| 2011/0068444 A1 * | 3/2011 | Chi | ..................... H01L 21/6835 257/669 |

* cited by examiner

*Primary Examiner* — Steven Loke
*Assistant Examiner* — Krista Soderholm
(74) *Attorney, Agent, or Firm* — Mintz Levin Cohn Ferris Glovsky and Popeo, P.C.

(57) ABSTRACT

An interposer is provided which includes: a substrate having a first surface with a plurality of first conductive pads and a second surface opposite to the first surface, the second surface having a plurality of second conductive pads; a plurality of conductive through holes penetrating the first and second surfaces of the substrate and electrically connecting the first and second conductive pads; and a first removable electrical connection structure formed on the first surface and electrically connecting a portion of the first conductive pads so as to facilitate electrical testing of the interposer.

8 Claims, 8 Drawing Sheets

INTERPOSER AND ELECTRICAL TESTING METHOD THEREOF

CROSS-REFERENCES TO RELATED APPLICATIONS

This application claims under 35 U.S.C. § 119(a) the benefit of Taiwanese Application No. 101109806, filed Mar. 22, 2012, the entire contents of which is incorporated herein by reference.

BACKGROUND OF THE INVENTION

1. Field of the Invention

The present invention relates to interposers and electrical testing methods thereof, and, more particularly, to an interposer having a plurality of conductive through holes and an electrical testing method thereof.

2. Description of Related Art

Figure 1:
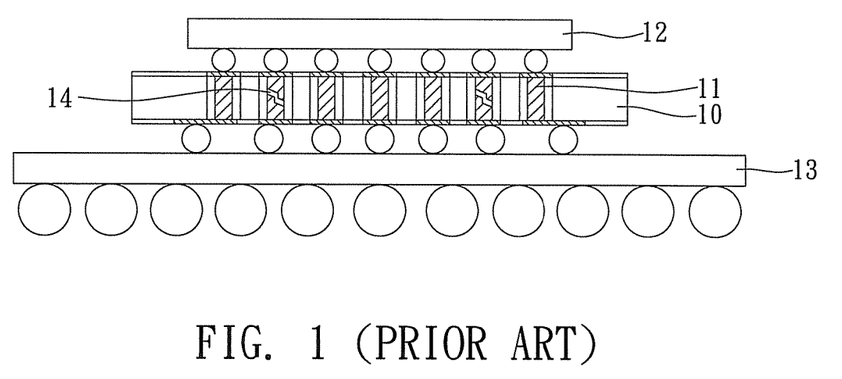
FIG. 1 is a cross-sectional view showing a conventional 3D-IC package structure.

FIG. 1 shows a cross-sectional view of a conventional 3D-IC package structure. Referring to FIG. 1, an interposer 10 having a plurality of copper posts 11 penetrating therethrough is disposed between a semiconductor chip 12 and a packaging substrate 13 to serve as an electrical connection bridge between the semiconductor chip 12 and the packaging substrate 13.

The copper posts 11 are formed by filling a copper material in a plurality of through holes 100 in the interposer 10. However, if the through holes 100 are not completely filled with the copper material, voids or crevices 14 may occur in the copper posts 11. The voids or crevices 14 cannot be inspected visually. Further, since the upper and lower surfaces of the interposer 10 have external conductive elements disposed thereon, a conventional wafer testing method cannot be used to detect the electrical performance of the interposer 10. Therefore, an effective electrical testing method of the interposer 10 is required so as to improve the yield of the 3D-IC package structure.

SUMMARY OF THE INVENTION

Accordingly, the present invention provides an interposer, which comprises: a substrate having a first surface with a plurality of first conductive pads and a second surface opposite to the first surface, the second surface having a plurality of second conductive pads; a plurality of conductive through holes penetrating the first and second surfaces of the substrate and electrically connecting the first and second conductive pads; and a first removable electrical connection structure formed on the first surface and electrically connected to a portion of the first conductive pads.

The present invention further provides an electrical testing method of an interposer, which comprises the steps of: providing an interposer, having a substrate having a first surface with a plurality of first conductive pads and a second surface opposite to the first surface, the second surface having a plurality of second conductive pads; a plurality of conductive through holes penetrating the first and second surfaces of the substrate and electrically connecting the first and second conductive pads; and a first removable electrical connection structure formed on the first surface and electrically connected to a portion of the first conductive pads; electrically connecting a plurality of probes to the interposer to test the interposer; and removing the first removable electrical connection structure.

A testing method of the interposer may be performed by complying a first portion of the probes to a first portion of the second conductive pads corresponding in position to the first removable electrical connection structure, and coupling a second portion of the probes to a second portion of the second conductive pads not corresponding in position to the first removable electrical connection structure.

According to the present invention, by forming a removable electrical connection structure on a surface of the interposer for electrically connecting a plurality of conductive pads on the surface, the conductive through holes in the interposer, the conductive pads on opposite surfaces of the interposer and the removable electrical connection structure form a circuit for electrical testing, the electrical performance of the conductive through holes. Thereafter, the removable electrical connection structure is removed without adversely affecting the interposer. Therefore, the present invention provides an effective electrical testing method of the interposer without adversely affecting the original design of the interposer.

BRIEF DESCRIPTION OF DRAWINGS

FIGS. 7A and 7B are schematic cross-sectional views showing an electrical testing method of an interposer according to a sixth embodiment of the present invention, wherein FIG. 7B shows another embodiment of FIG. 7A.

DETAILED DESCRIPTION OF PREFERRED EMBODIMENTS

The following illustrative embodiments are provided to illustrate the disclosure of the present invention, these and other advantages and effects can be apparent to those in the art after reading this specification.

It should be noted that the drawings are only for illustrative purposes and not intended to limit the present invention. Meanwhile, terms such as "side," "end," "on," "a," etc. are only used as a matter of descriptive convenience and not intended to have any other significance or provide limitations for the present invention.

Figure 2A:
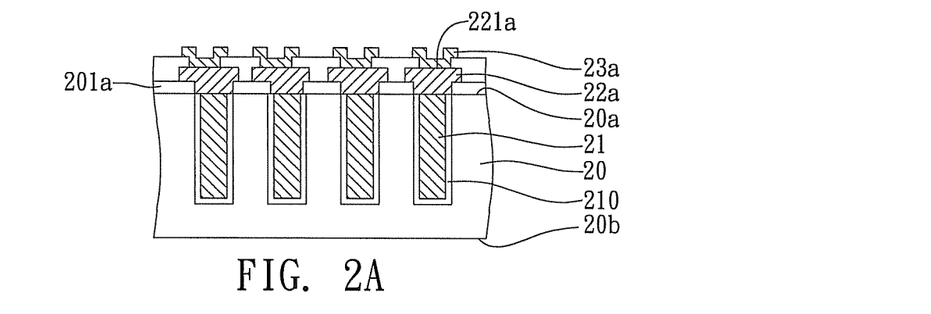
FIGS. 2A to 2K are cross-sectional views showing an electrical testing method of an interposer according to a first embodiment of the present invention, wherein FIG. 2H' shows another embodiment of FIG. 2H.
Figure 2B:
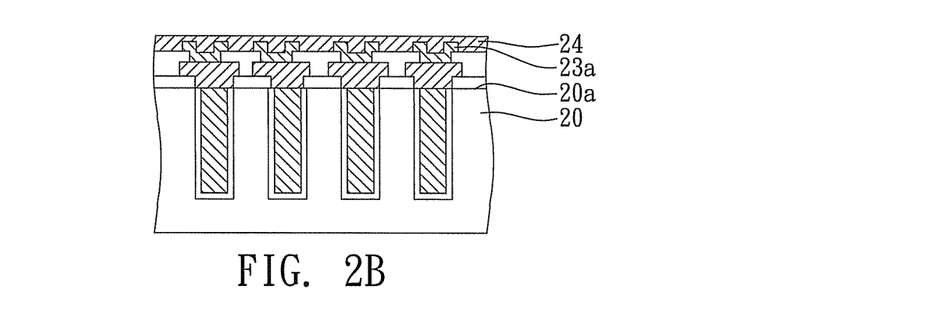
Figure 2C:
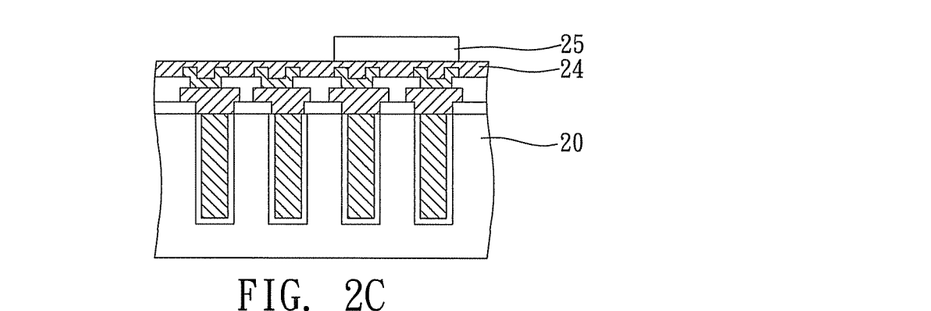
Figure 2D:
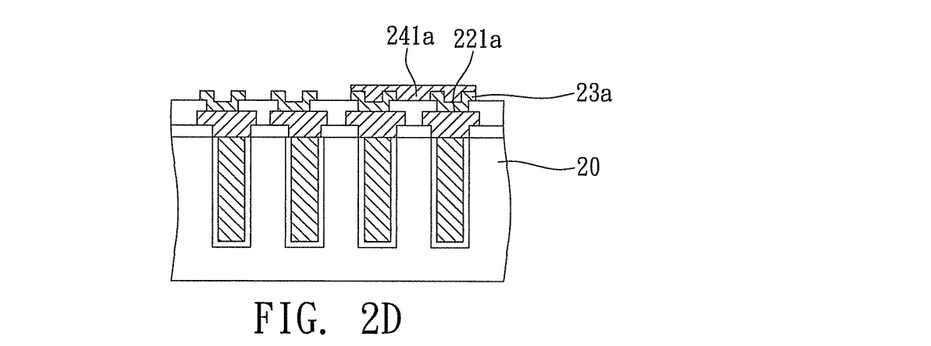
Figure 2E:
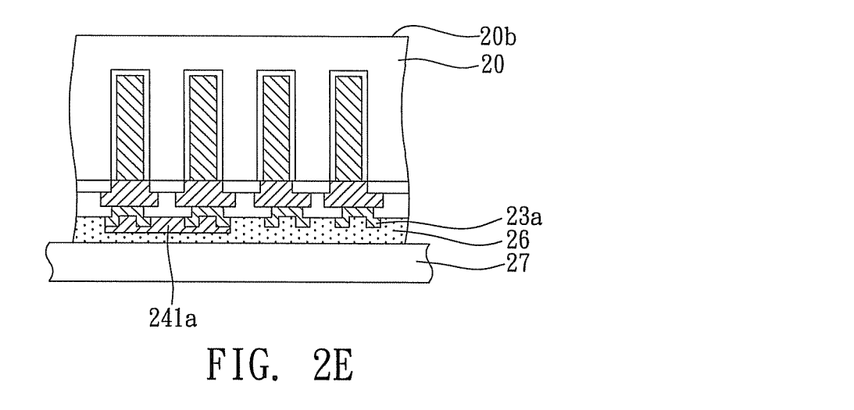
Figure 2F:
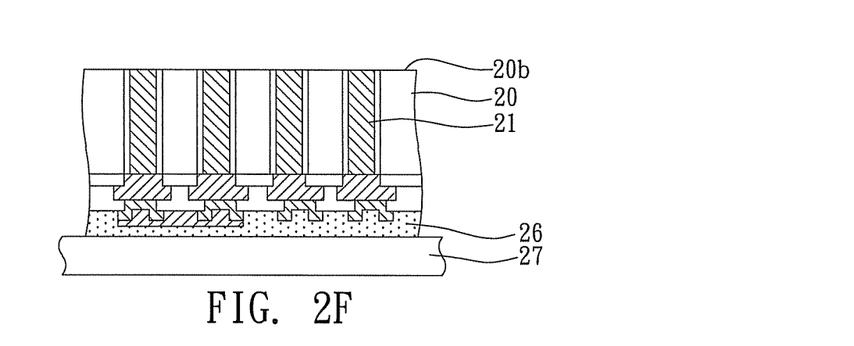
Figure 2G:
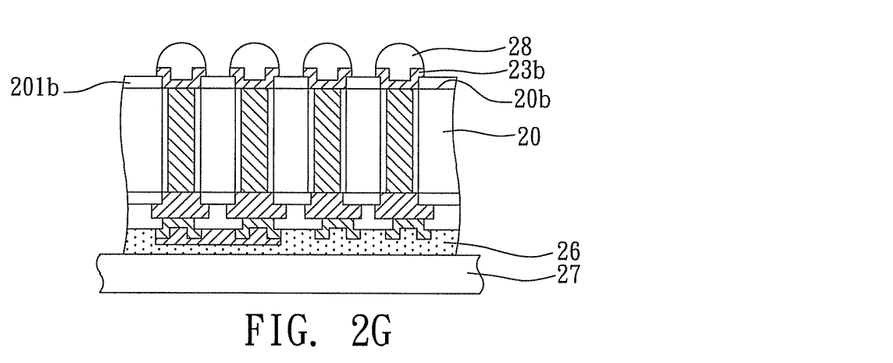
Figure 2H:
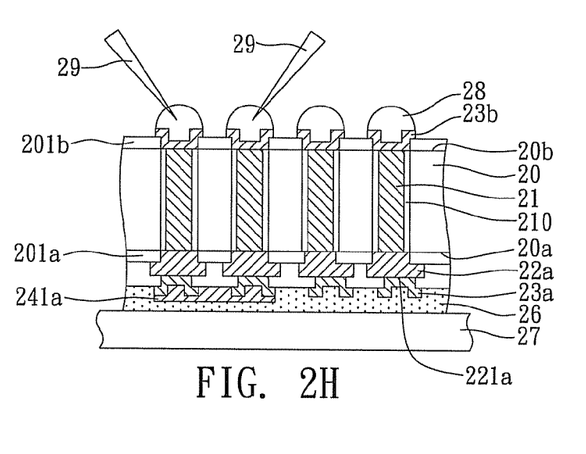

FIGS. 2A to 2K are cross-sectional views showing an electrical testing method of an interposer according to a first embodiment of the present invention. FIG. 2H' shows another embodiment of FIG. 2H.

Referring to FIG. 2A, an interposer is provided. The interposer has a substrate 20 having opposite first and second surfaces 20a, 20b and a plurality of conductive through holes 21 formed therein. The first surface 20a of the substrate 20 has at least a first redistribution layer (RDL) 22a. The outermost first redistribution layer 22a has a plurality of first conductive pads 221a electrically connected to the conductive through holes 21, and a UBM (Under Bump Metallurgy) layer 23a is further formed on the first conductive pads 221a. An insulating layer 210 made of $SiO_2$ or SiN is formed between the substrate 20 and each of the conductive through holes 21. The substrate 20 can be made of silicon or glass, and have a thickness less than or equal to 200 um, preferably less than 100 um. In addition, a first passivation layer 201a can be formed on the first surface 20a of the substrate 20 and have a plurality of openings for exposing the conductive through holes 21. The first surface 20a can be connected to another substrate (not shown) and the second surface 20b can be connected to a semiconductor chip (not shown), or vice versa.

Referring to FIG. 2B, a metal layer 24 is formed on the first surface 20a and the UBM layer 23a by sputtering. In the present embodiment, only one metal layer is provided. In other embodiments, a plurality of metal layers 24 can be provided and made of the same or different materials. The metal layer 24 can be made of Al, Ni, NiV, W, Ti, TiW, Cr, Ta, Au or Cu.

Referring to FIG. 2C, a positive or negative photoresist layer is formed on the metal layer 24, and exposed and developed so as to be formed as a patterned resist layer 25. In the present embodiment, the patterned resist layer 25 is formed between two adjacent first conductive pads 221a for covering the metal layer 24 between the two first conductive pads 221a while exposing other regions.

Referring to FIG. 2D, by using the patterned resist layer 25 as a mask, the metal layer 24 exposed from the patterned resist layer 25 is removed by dry etching or wet etching and a first removable electrical connection structure 241a is formed for electrically connecting a portion of the first conductive pads 221a with the conductive through holes 21. Then, the patterned resist layer 25 is removed. In the present embodiment, the first removable electrical connection structure 241a is formed on the first UBM layer 23a of the first conductive pads 221a and made of a material different from that of the first UBM layer 23a, and, after a subsequent electrical test is performed, the first removable electrical connection structure 241a can be removed through selective etching. Alternatively, the first removable electrical connection structure 241a can be directly formed on two adjacent first conductive pads 221a and electrically connecting the two first conductive pads 221a.

Referring to FIG. 2E, the first surface 20a of the substrate 20 having the first removable electrical connection structure 241a is mounted on a carrier 27 through an adhesive layer 26. The carrier 27 can be an adhesive tape having a frame, or a metal plate or glass having an adhesive layer.

Referring to FIG. 2F, a portion of the substrate 20 is removed from the second surface 20b by grinding or etching, thereby exposing the ends of the conductive through holes 21. In the present embodiment, the second surface 20b is ground to be in a certain thickness without exposing the conductive through holes 21, and then an etching process is performed to expose the conductive through holes 20.

Referring to FIG. 2O, a second passivation layer 201b is formed to cover the second surface 20b and has a plurality of openings for exposing the conductive through holes 21. The second passivation layer 201b can be made of $SiO_2$ or SiN. Then, a second UBM layer 23b is formed in each of the openings of the second passivation layer 201b for electrically connecting the corresponding conductive through hole 21. Alternatively, a redistribution layer and a plurality of conductive pads can be formed on the second surface 20b, and the second UBM layer 23b can be formed on the conductive pads. The second UBM layer 23b can be made of Al, Ni, NiV, W, Ti, TiW, Cr, Ta, Au or Cu. A plurality of conductive bumps 28 are formed on the second UBM layer 23b by printing, electroplating or ball mounting. In other embodiments, each of the conductive bumps 28 has a copper post disposed on the second UBM layer 23b and a solder layer disposed on the copper post.

Referring to FIG. 2H, the interposer is tested through the first removable electrical connection structure 241a. In particular, two probes 29 are connected to the conductive bumps 28 corresponding in position to the first removable electrical connection structure 241a, and an electrical test can be performed to determine the electrical conductivity between the two probes 29. The conductive bumps 28, the conductive through holes 21 and the first removable electrical connection structure 241a form a circuit. If no crevice or void occurs in the conductive through holes 21, the circuit allows currents to flow therethrough. As such, the electrical performance of the two conductive through holes 21 in the circuit can be determined by measuring the currents between the two conductive bumps 28. On the other hand, if a void or crevice occurs in the conductive through holes 21 and the circuit is broken, currents cannot flow through the circuit. As such, no current is measured between the two conductive bumps 28, and the interposer can be determined to be defective. Similarly, in order to test whether a short circuit or current leakage occurs in the interposer, one of the probes 29 is connected to a conductive bump 28 that corresponds in position to the first removable electrical connection structure 241a, and another probe 29 is connected to a conductive bump 28 that does not correspond in position to the first removable electrical connection structure 241a. Since the above-described two conductive bumps 28 are not electrically connected to each other through the first removable electrical connection structure 241a, the circuit should be open. By testing the electrical conductivity between the two probes 29, it can be determined whether a short circuit or current leakage occurs between the two conductive bumps 28, as shown in FIG. 2H'.

Figure 2I:
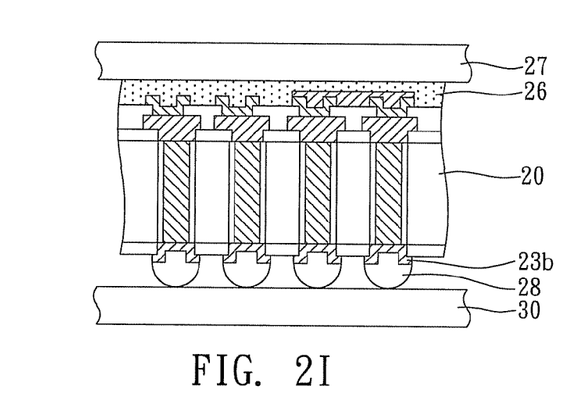

Referring to FIG. 2I, the second surface of the interposer is mounted on a carrier 30. In the present embodiment, the carrier 30 can be an adhesive tape having a frame, and the adhesive tape can be removed by UV light or heat treatment.

Figure 2J:
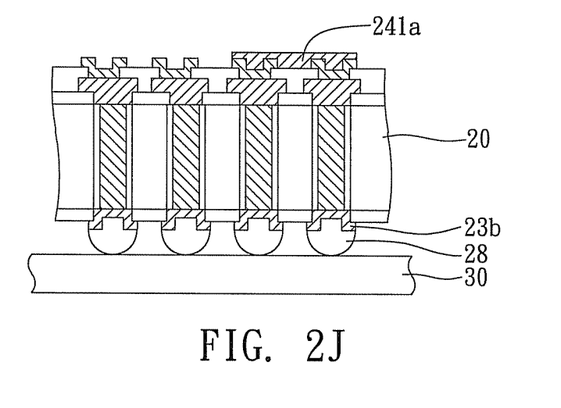

Referring to FIG. 2J, the carrier 27 and the adhesive layer 26 are removed. By removing the adhesive property of the adhesive layer 26 through UV light or heat treatment or removing the adhesive layer 26 with a solvent, the carrier 27 can be removed. After the carrier 27 is removed, the surface of the interposer can be cleaned by using a solvent or plasma.

Figure 2K:
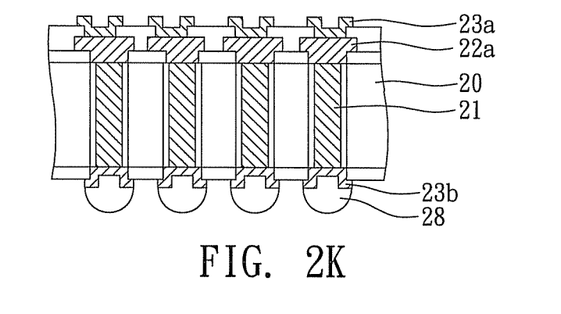
Figure 3:
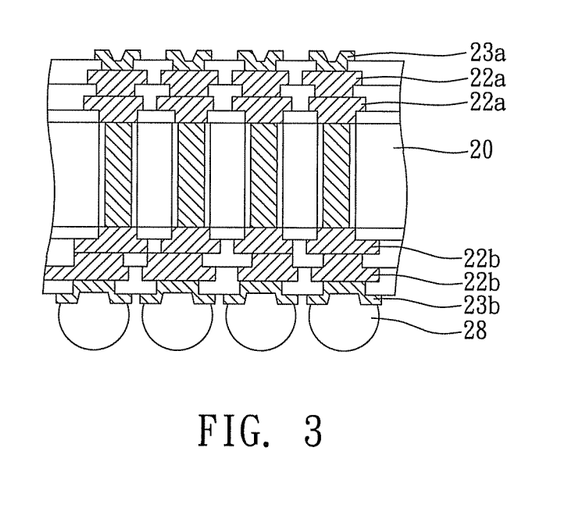
FIG. 3 is a cross-sectional view showing an electrical testing method of an interposer according to a second embodiment of the present invention.

Referring to FIG. 2K, the first removable electrical connection structure 241a and the carrier 30 are removed. In the present embodiment, the first removable electrical connection structure 241a is made of Al and the first UBM layer 23a is made of Ti/Cu. By performing a dry etching using $BCl_3$ gas, the first removable electrical connection structure 241a made of Al is removed without adversely affecting the UBM layer 23a made of Ti/Cu. In other embodiments, different materials and different removing methods can be applied. Through the above-described processes, an interposer such as a through silicon interposer (TSI) is obtained. Referring to FIG. 3, in another embodiment, the first surface 20a can have a plurality of first redistribution layers 22a, and the second surfaces 20b can have a plurality of second redistribution layers 22b.

Figure 4:
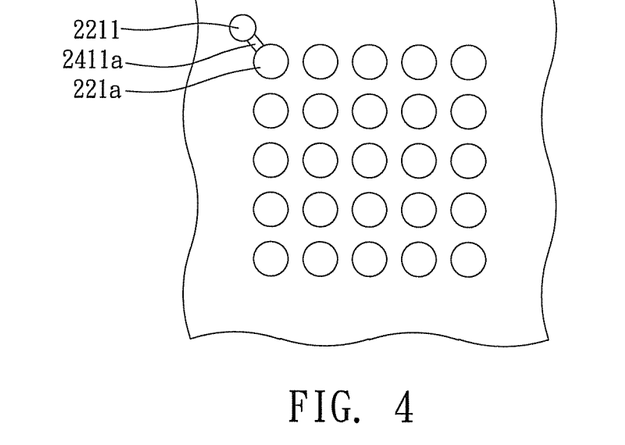
FIG. 4 is a top view showing an electrical testing method of an interposer according to a third embodiment of the present invention.

FIG. 4 shows an electrical testing method of an interposer according to a third embodiment of the present invention.

The first surface 20a of the substrate 20 further has at least a testing pad 2211 electrically connected to one of the first conductive pads 221a through a circuit 2411a. Alternatively, the testing pad 2211 can be disposed on the second surface 20b. To perform an electrical test, a probe 29 can be connected to the testing pad 2211 instead of the corresponding first conductive pad 221a, thereby protecting the surface of the first conductive pad 221a from being damaged by the probe 29 so as to ensure the product reliability.

Figure 5A:
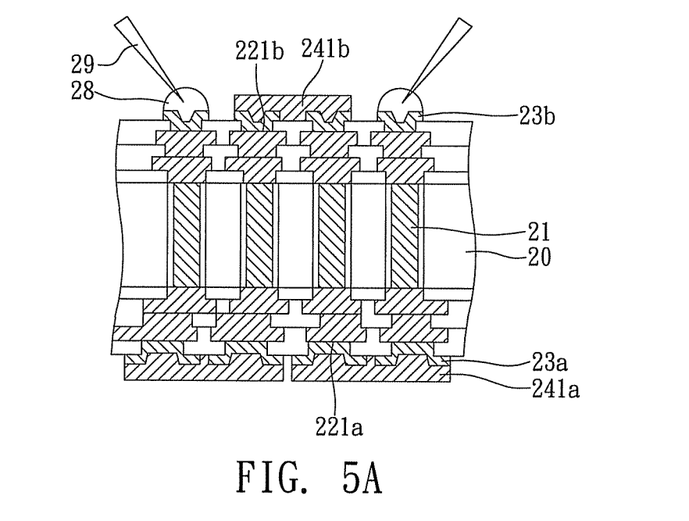
FIGS. 5A and 5B are cross-sectional and top views showing an electrical testing method of an interposer according to a fourth embodiment of the present invention.
Figure 5B:
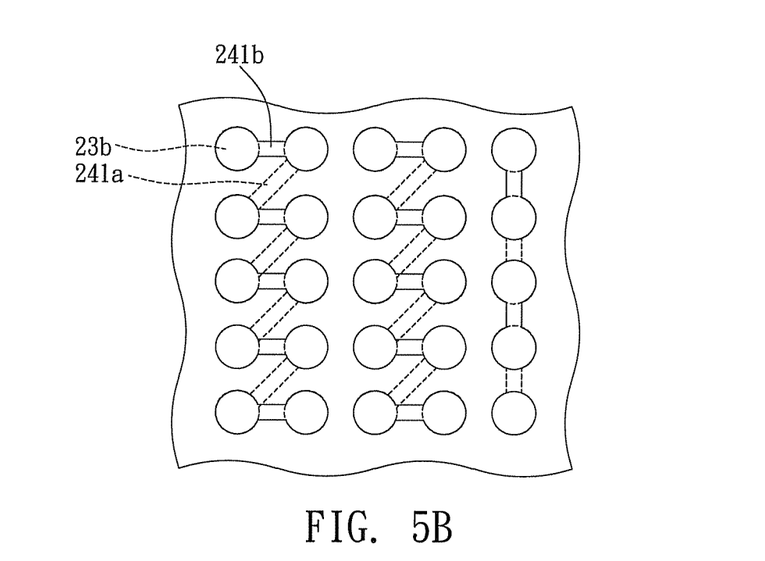

FIGS. 5A and 5B are schematic cross-sectional and top views of an electrical testing method of an interposer according to a fourth embodiment of the present invention.

The fourth embodiment differs from the second embodiment in that a second removable electrical connection structure 241b is formed on the second surface 20b and electrically connected to a portion of the second UBM layer 23b. The first and second conductive pads 221a, 221b, the first and second removable electrical connection structures 241a, 241b, and the conductive through holes 21 form a daisy chain structure. By measuring the impedance of the daisy chain structure, the present invention can determine whether the interposer has defective conductive through holes that lead to increase of the impedance value.

Figure 6:
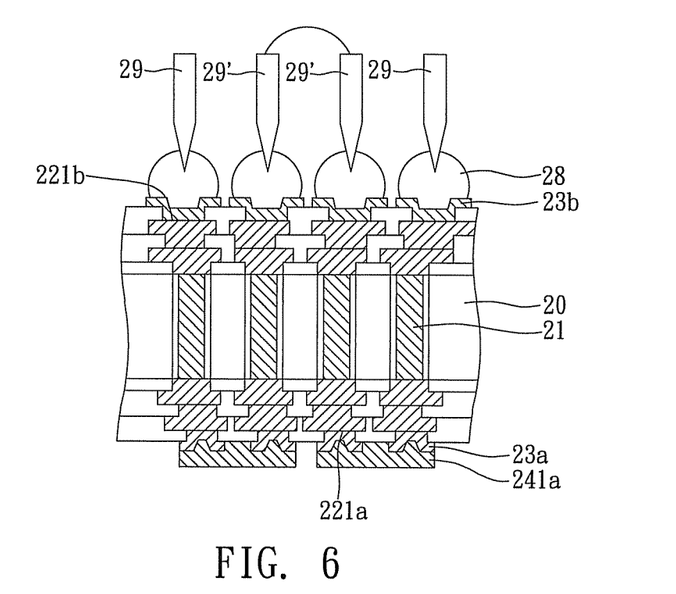
FIG. 6 is a cross-sectional view showing an electrical testing method of an interposer according to a fifth embodiment of the present invention.

FIG. 6 shows an electrical testing method of an interposer according to a fifth embodiment of the present invention. The fifth embodiment differs from the fourth embodiment in that two probes 29' are connected in series to replace the second removable electrical connection structure 241b of the fourth embodiment, and the first and second conductive pads 221a, 221b, the conductive through holes 21, the first removable electrical connection structure 241a, and the probes 29' form a daisy chain structure. In other embodiments, the probes 29, 29' can be designed as a general purpose testing board in which a portion of probes or test pads are electrically connected to each other so as to form a daisy chain structure together with the conductive through holes 21 and the first removal electrical connection structure 241a.

Figure 7A:
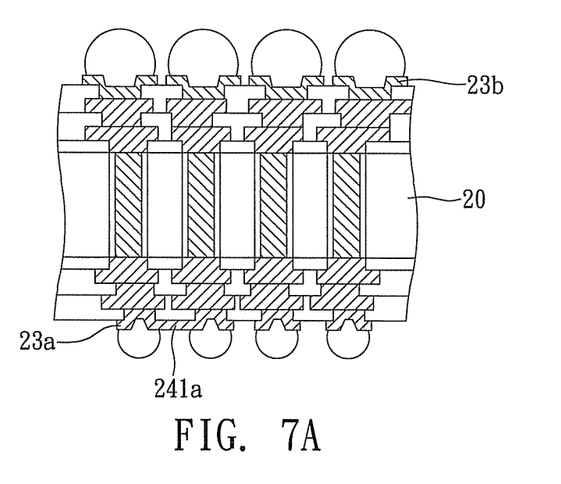
Figure 7B:
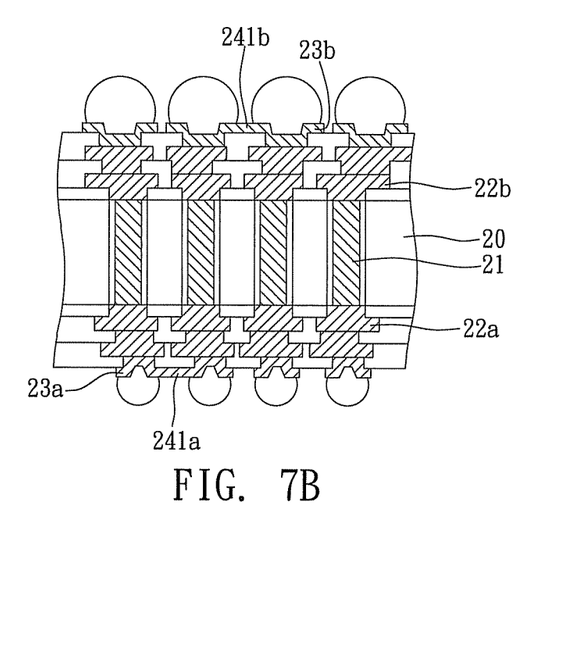

FIGS. 7A and 7B are schematic cross-sectional views showing an electrical testing method of an interposer according to a sixth embodiment of the present invention. FIG 7B shows another embodiment of FIG. 7A.

The sixth embodiment differs from the second embodiment in that the first removable electrical connection structure 241a and the UBM layer 23a are integrally formed in the present embodiment, as shown in FIG. 7A. Alternatively, the first and second removable electrical connection structures 241a, 241b are integrally formed with the first and second UBM layers 23a, 23b, respectively, as shown in FIG. 7B.

In an embodiment, the first removable electrical connection structure 241a and the second removable electrical connection structure 241b can be integrally formed with the first redistribution 22a and the second redistribution 22b, respectively. The present invention further provides an interposer, which has: a substrate 20 having a first surface 20a with a plurality of first conductive pads 221a and a second surface 20b opposite to the first surface 20a and having a plurality of second conductive pads 221b; a plurality of conductive through holes 21 penetrating the first and second surfaces 20a, 20b of the substrate 20 so as to electrically connect the first and second conductive pads 221a, 221b; and a first removable electrical connection structure 241a formed on the first surface 20a and electrically connected to a portion of the first conductive pads 221a.

In the above-described interposer, the first removable electrical connection structure 241a can be integrally formed with the first conductive pads 221a. Alternatively, the first removable electrical connection structure 241a is a metal layer 24 or a wiring layer formed on the first conductive pads 221a and the first surface 20a.

In the above-described interposer, the first conductive pads 221a can further have a first UBM (Under Bump Metallurgy) layer 23a formed thereon, and the second conductive pads 221b can further have a second UBM layer 23b formed thereon. The first removable electrical connection structure 241a is interposed between the first conductive pads 221a and the first UBM layer 23a. The second removable electrical connection structure 241b is interposed between the second conductive pads 221b and the second UBM layer 23b.

In the above-described interposer, the first surface 20a can have at least a first redistribution layer 22a, and the second surface 20b can have at least a second redistribution layer 22b. The outermost first redistribution layer 22a and the outermost second redistribution layer 22b have the first conductive pads 221a and the second conductive pads 221b, respectively.

In the above-described interposer, the first surface 20a can further have at least a testing pad 2211 electrically connected to one of the first conductive pads 221a through a circuit 2411a. The interposer can further have a second removable electrical connection structure 241b formed between a portion of the second conductive pads 221b, and the first conductive pads 221a, the second conductive pads 221b, the first removable electrical connection structure 241a, the second removable electrical connection structure 241b, and the conductive through holes 21 form a daisy chain structure.

The interposer can further have a plurality of conductive bumps 28 disposed on the second conductive pads 221b. The substrate 20 can have a thickness less than or equal to 200 um.

According to the present invention, by forming a removable electrical connection structure on a surface of the interposer for electrically connecting a plurality of conductive pads on the surface, the conductive through holes in the interposer, the conductive pads on opposite surfaces of the interposer and the removable electrical connection structure form a circuit for electrical testing, thereby determining the electrical performance of the conductive through holes. Thereafter, the removable electrical connection structure is removed without adversely affecting the interposer. Therefore, the present invention provides an effective electrical testing method of the interposer, without adversely affecting the original design of the interposer.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:
1. An interposer, comprising:
   a substrate having a first surface with a plurality of first conductive pads and a second surface opposite to the first surface, the second surface having a plurality of second conductive pads;
   a plurality of conductive through holes penetrating the first and second surfaces of the substrate and electrically connecting the first and second conductive pads; and a first removable electrical connection structure formed on the first surface and electrically connected to at least two adjacent first conductive pads, wherein the first removable electrical connection structure is a metal layer or a wiring layer formed on the first conductive pads and the first surface.

2. The interposer of claim 1, wherein the first removable electrical connection structure is integrally formed with the first conductive pads.

3. The interposer of claim 1, wherein the first conductive pads further have a first under bump metallurgy (UBM) layer formed thereon, and the second conductive pads further have a second UBM layer formed thereon, such that the first removable electrical connection structure is interposed between the first conductive pads and the first UBM layer, and a second removable electrical connection structure is interposed between the second conductive pads and the second UBM layer.

4. The interposer of claim 1, wherein the first surface further has at least a first redistribution layer, and the second surface further has at least a second redistribution layer.

5. The interposer of claim 1, wherein the first surface further has at least a testing pad electrically connected to one of the first conductive pads.

6. The interposer of claim 1, further comprising a second removable electrical connection structure formed on the second surface and electrically connected to a portion of the second conductive pads, the first and second conductive pads, the first and second removable electrical connection structures, and the conductive through holes to form a daisy chain structure.

7. The interposer of claim 1, further comprising a plurality of conductive bumps disposed on the second conductive pads.

8. The interposer of claim 1, wherein the substrate is less than or equal to 200 um in thickness.

\* \* \* \* \*